US008156901B2

(12) United States Patent  (10) Patent No.: US 8,156,901 B2
Muelken                    (45) Date of Patent: Apr. 17, 2012

(54) PET RESTRAINT SYSTEM

(76) Inventor: David Muelken, New York, NY (US)

( * ) Notice: Subject to any disclaimer, the term of this patent is extended or adjusted under 35 U.S.C. 154(b) by 280 days.

(21) Appl. No.: 12/490,789

(22) Filed: Jun. 24, 2009

(65) Prior Publication Data
US 2009/0255484 A1 Oct. 15, 2009

Related U.S. Application Data

(63) Continuation-in-part of application No. 12/047,843, filed on Mar. 13, 2008, now Pat. No. 7,980,201.

(51) Int. Cl.
A01K 15/02 (2006.01)
(52) U.S. Cl. .......................... 119/720; 119/794
(58) Field of Classification Search .............. 119/712, 119/719, 720, 721, 792, 793, 795, 769, 770, 119/772, 794, 796, 797, 798, 859, 857, 858, 119/863, 865, 905, 908; 340/573.2, 573.3, 340/573.7, 539.13, 686.1; 367/139; 24/615, 24/625, 629, 182; 70/30, 312, 14, 18, 19; D8/333, 343; D11/216
See application file for complete search history.

(56) References Cited

U.S. PATENT DOCUMENTS

| | | | | |
|---|---|---|---|---|
| 4,621,589 A * | 11/1986 | Thinnes | | 119/770 |
| 5,322,037 A * | 6/1994 | Tozawa | | 119/865 |
| 5,517,836 A * | 5/1996 | Hong | | 70/30 |
| 5,815,077 A * | 9/1998 | Christiansen | | 340/573.3 |
| 5,857,433 A * | 1/1999 | Files | | 119/720 |
| 5,923,254 A * | 7/1999 | Brune | | 340/573.3 |
| 5,952,959 A * | 9/1999 | Norris | | 342/357.34 |
| 6,205,956 B1 * | 3/2001 | Dickie et al. | | 119/792 |
| 6,421,001 B1 * | 7/2002 | Durst et al. | | 342/357.55 |
| 6,441,778 B1 * | 8/2002 | Durst et al. | | 342/357.55 |
| 6,487,992 B1 * | 12/2002 | Hollis | | 119/712 |
| 6,532,903 B2 * | 3/2003 | Prusia et al. | | 119/792 |
| 6,700,492 B2 * | 3/2004 | Touchton et al. | | 340/573.1 |
| 6,715,449 B1 * | 4/2004 | Jordan | | 119/863 |
| 6,720,879 B2 * | 4/2004 | Edwards | | 340/573.3 |
| 7,174,859 B2 * | 2/2007 | Lee | | 119/863 |
| 7,602,302 B2 * | 10/2009 | Hokuf et al. | | 340/573.3 |
| 7,821,406 B2 * | 10/2010 | Wangrud | | 340/573.1 |
| 2006/0037559 A1 * | 2/2006 | Belcher | | 119/720 |
| 2006/0097882 A1 * | 5/2006 | Brinkerhoff et al. | | 340/573.2 |
| 2006/0270421 A1 * | 11/2006 | Phillips et al. | | 455/457 |
| 2008/0159079 A1 * | 7/2008 | Dir et al. | | 367/139 |

* cited by examiner

Primary Examiner — T. Nguyen
(74) Attorney, Agent, or Firm — Dale J. Ream

(57) ABSTRACT

A pet restraint system includes a collar having first and second ends and a fastener to selectively secure the first and second collar ends about a pet. A radio transmitter is coupled to the collar that emits a signal at a predetermined frequency. The system includes a handheld unit separated from the collar that includes a radio receiver configured to receive a radio signal, a GPS receiver for receiving signals from global positioning satellites, a signal indicator, and a CPU in data communication with the radio receiver, GPS receiver, and signal indicator. The CPU includes programming for evaluating a relative strength of signals received by the radio receiver and for outputting the relative strength to the signal indicator indicative of a position of the signal transmitter relative to the handheld unit. The CPU also includes programming for evaluating GPS signals and determining a global position of the handheld unit.

8 Claims, 18 Drawing Sheets

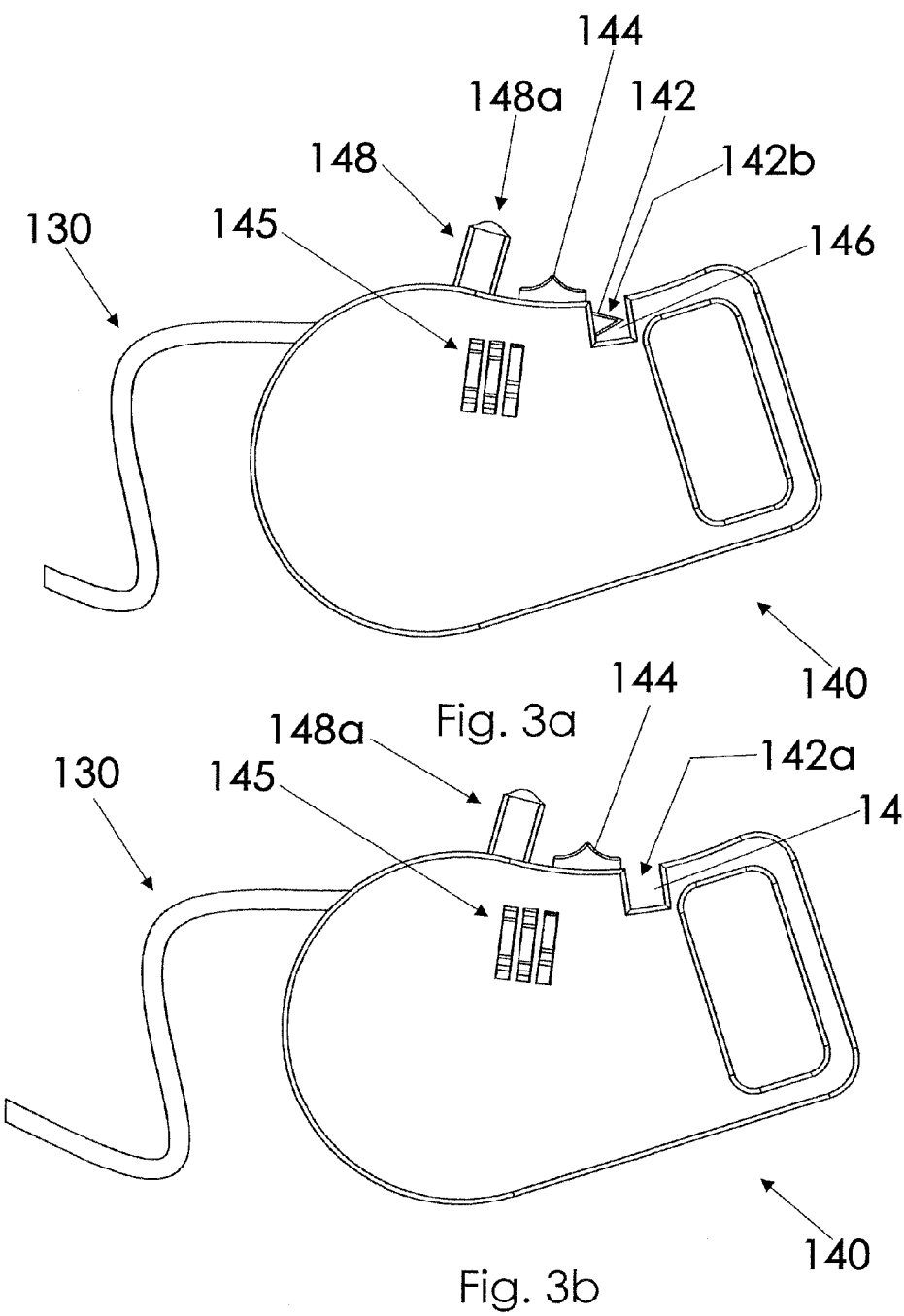

PET RESTRAINT SYSTEM

REFERENCE TO RELATED APPLICATIONS

This application claims priority to U.S. application Ser. No. 12/047,843 filed on Mar. 13, 2008 now U.S. Pat. No. 7,980,201 entitled Pet Restraint System.

BACKGROUND OF THE INVENTION

This invention relates generally to pet restraints and, more particularly, to a pet restraint system that prevents a pet's collar from being removed, that locks a leash to a pet's collar, and that includes a leash lock for selectively locking a leash to another object.

One of a pet owner's greatest concerns is that his pet will become lost or stolen. A pet may be stolen even when its leash is tied to another object in that a thief may completely remove a pet's collar to which the leash is attached. Even if the collar is not removed, both the leash and the pet may be stolen together if the leash and pet are merely tied to another object and the owner is not present. Further, the inclusion of locks on a collar or leash is irrelevant if a thief has sufficient tools to cut though or otherwise remove a pet's collar Various devices have been proposed in the art for preventing the theft of a pet, such as with devices for locking a leash to an object. Proposals for locking devices relevant to pet restraints are found in U.S. Pat. Nos. 6,095,094, 6,371,056, 5,462,019, and 6,269,777. Although assumably effective for their intended purposes, the existing devices do not provide a combination of locking mechanisms for locking a collar to a pet (preventing unwanted collar removal), locking a leash to a collar, and locking a leash to another object.

Therefore, it would be desirable to have a pet restraint system that prevents a pet collar from being removed from a pet, provides a leash lock that locks a leash to a collar, and enables a leash to be locked to another object apart from the restraint system.

SUMMARY OF THE INVENTION

Therefore, a pet restraint system according to the present invention includes a flexible collar having first and second ends. A fastener is configured to selectively secure together the first and second collar ends so as to present an adjustable circumference for encircling a portion of a pet. The fastener includes a first lock configured to restrict separation of the first and second collar ends. The pet restraint system further includes an elongate leash having first and second ends. A clip is permanently coupled to the leash first end and is configured to removably attach the leash first end to the collar. A second lock is included and configured to restrict removal of the clip from the collar.

The pet restraint system further includes a handle that is permanently coupled to the leash second end. The handle includes a retracting mechanism coupled to the leash second end so as to selectively retract the leash to a plurality of retraction positions. The handle further includes a leash catch movable between a release position and a hold position, the leash catch interacting with at least one of the leash and retracting mechanism when at the hold position to secure the leash at a respective retracted position. The handle includes a protrusion configured to restrain the leash only when at the hold position. In addition, the handle includes a third lock configured to restrict movement of the leash catch from the hold position and restrict movement of the protrusion from the hold position.

Another embodiment of the pet restraint system includes a flexible collar having first and second ends and a plurality of holes therebetween and a fastener configured to selectively secure together the first and second collar ends to present an adjustable circumference for encircling a portion of a pet. The system further includes a radio transmitter coupled to the collar that emits a signal at a predetermined frequency. The system includes a handheld unit separated from the collar that includes a radio receiver configured to receive a radio signal, a GPS receiver adapted to receive signals from global positioning satellites, a signal indicator, and a central processing unit (CPU) in data communication with the radio receiver, GPS receiver, and signal indicator. The CPU includes programming for evaluating a relative strength of signals received by the radio receiver and programming to output the relative strength to the signal indicator indicative of a position of the signal transmitter relative to the handheld unit. The CPU may also include programming for evaluating GPS signals and determining a global position of the handheld unit.

Therefore, a general object of the present invention is to provide a pet restraint system that properly restrains a pet while minimizing the risk of the pet being stolen.

Another object of the present invention is to provide a pet restraint system, as aforesaid, that prevents unauthorized removal of a pet's collar.

Still another object of the present invention is to provide a pet restraint system, as aforesaid, that prevents unauthorized removal of a leash from a pet's collar.

Yet another object of the present invention is to provide a pet restraint system, as aforesaid, that prevents unauthorized removal of a leash secured to a stationary object.

A further object of the present invention is to provide a pet restraint system, as aforesaid, having a retractable leash for comfortable and convenient walking of a pet.

A still further object of the present invention is to provide a pet restraint system, as aforesaid, that prevents the leash from being removably cut.

Another object of the present invention is to provide a pet restraint system, as aforesaid, that can determine a position of the collar relative to a remote handheld device and a global position of the handheld unit.

Other objects and advantages of this invention will become apparent from the following description taken in connection with the accompanying drawings, wherein is set forth by way of illustration and example, embodiments of this invention.

BRIEF DESCRIPTION OF THE DRAWINGS

FIG. 3a is an side view on an enlarged scale of the handle as in FIG. 2 with the protrusion in a hold position;

FIG. 3b is side view of the handle as in FIG. 3a with the protrusion in a release position;

FIG. 5b is an isolated view on an enlarged scale taken from a portion of FIG. 5a;

FIG. 6 is an exploded view of the casing as in FIG. 5a;

FIG. 11b is a sectional view taken along line 11b-11b of FIG. 11a;

FIG. 13 is a fragmentary view of the handle as in FIG. 3a.

FIG. 14a is a perspective view of a collar according to an alternative embodiment of the present invention;

FIG. 14b is a top view of the collar as in FIG. 14a;

DESCRIPTION OF THE PREFERRED EMBODIMENT

A pet restraint system will now be described in detail with reference to FIG. 1 through FIG. 13 of the accompanying drawings. More particularly, the pet restraint system 100 includes a flexible collar 110.

Figure 7:
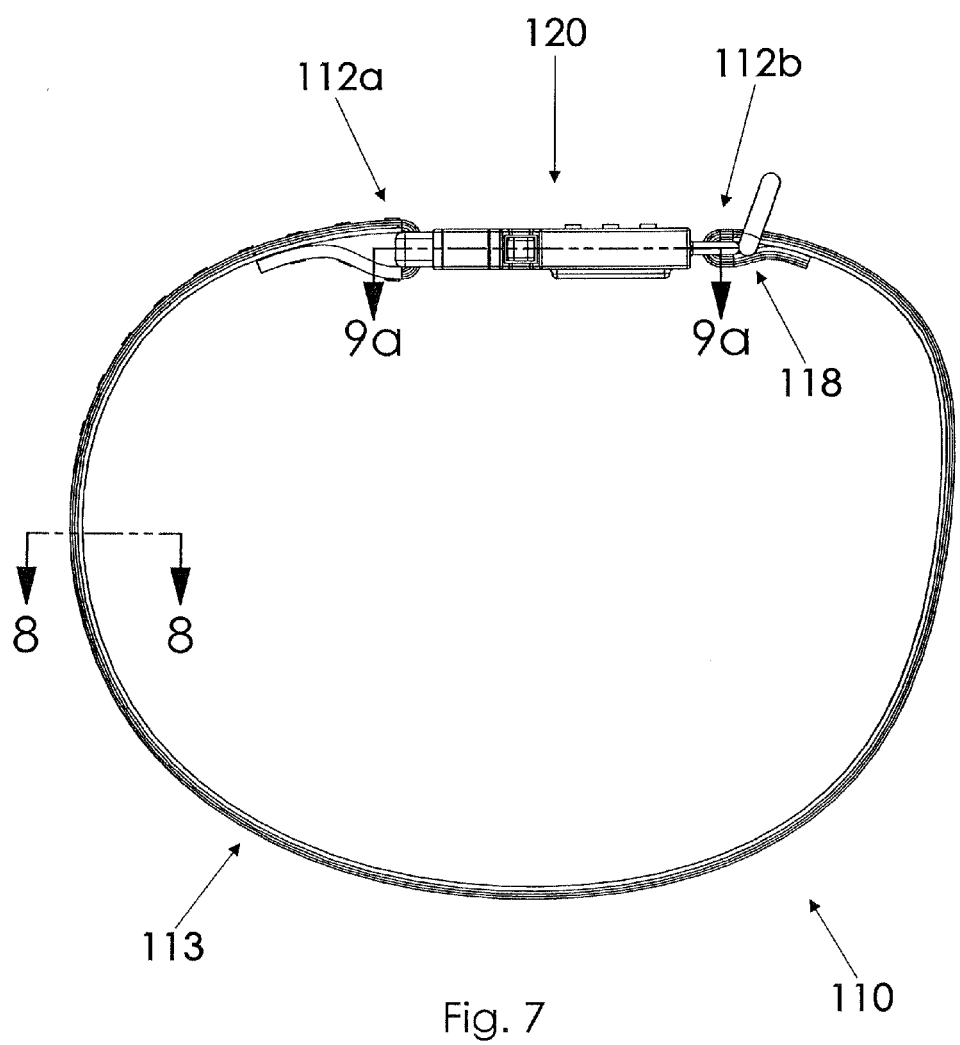
FIG. 7 is a top view of the collar as in FIG. 1.
Figure 8:
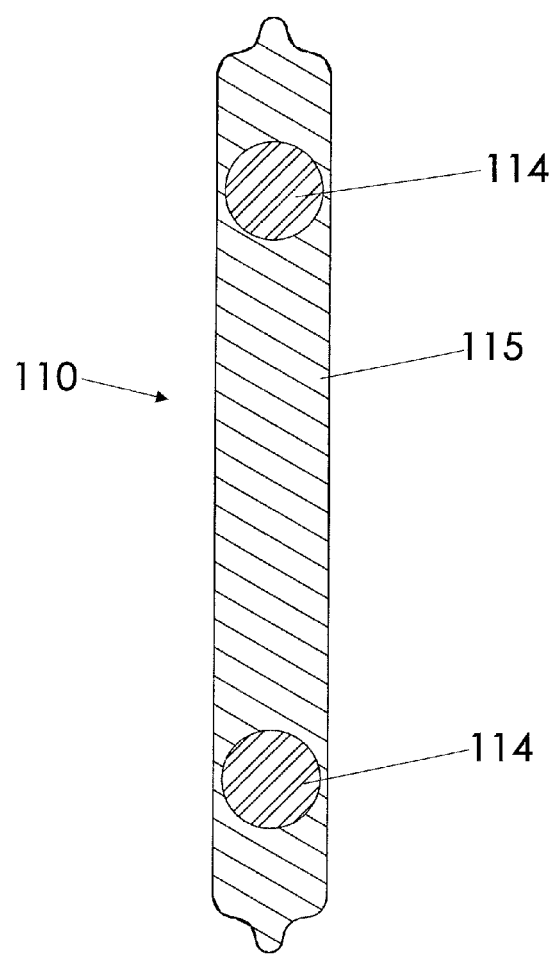
FIG. 8 is a sectional view taken along line 8-8 of FIG. 7.

As shown in FIG. 7, the flexible collar 110 has first and second ends 112a, 112b. A fastener 120 is configured to selectively secure together the first and second ends 112a, 112b of the collar 110 to present an adjustable circumference 113 for encircling a portion of a pet (e.g., a dog's neck). The fastener 120 includes a lock 128 (FIG. 1) configured to restrict separation of the first and second collar ends 112a, 112b. The collar 110 may include a cut-resistant material 114 (e.g., metal, etc.) permanently affixed within an outer member 115 (e.g., cloth, soft plastic, etc.), as shown in FIG. 8.

Figure 5A:
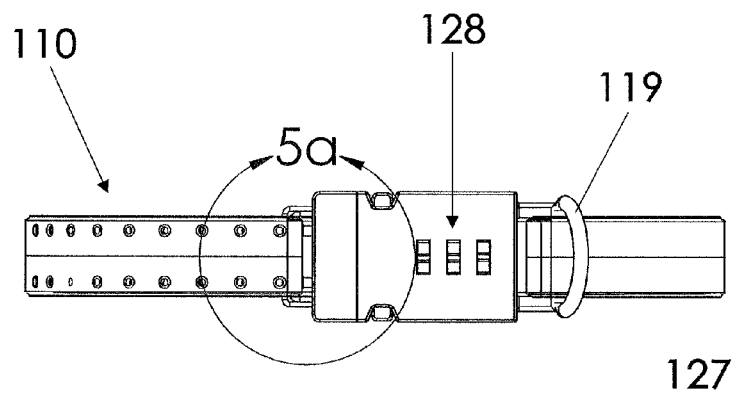
FIG. 5a is front view of the collar and casing as in FIG. 1.
Figure 5B:
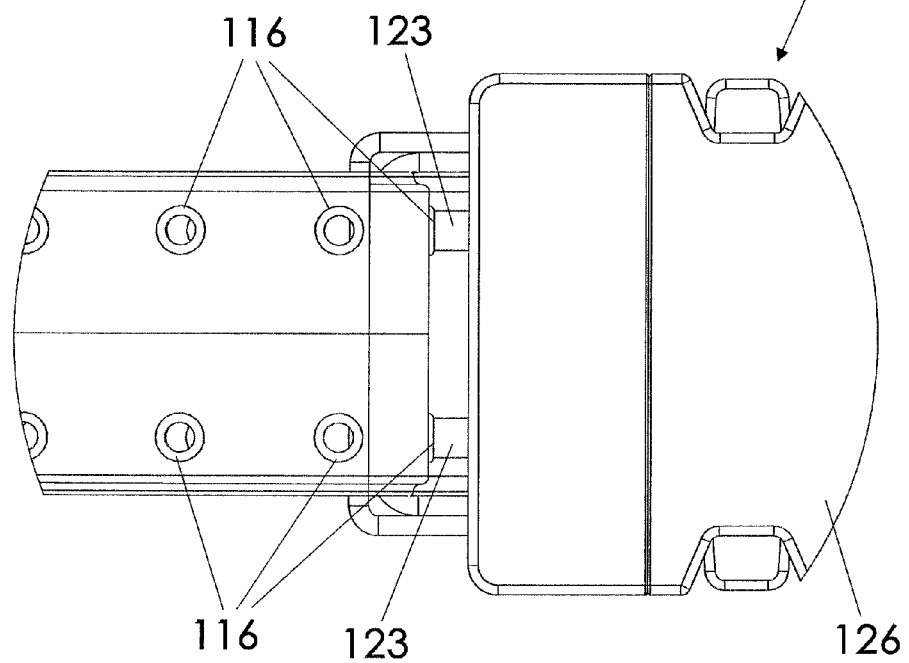
Figure 6:
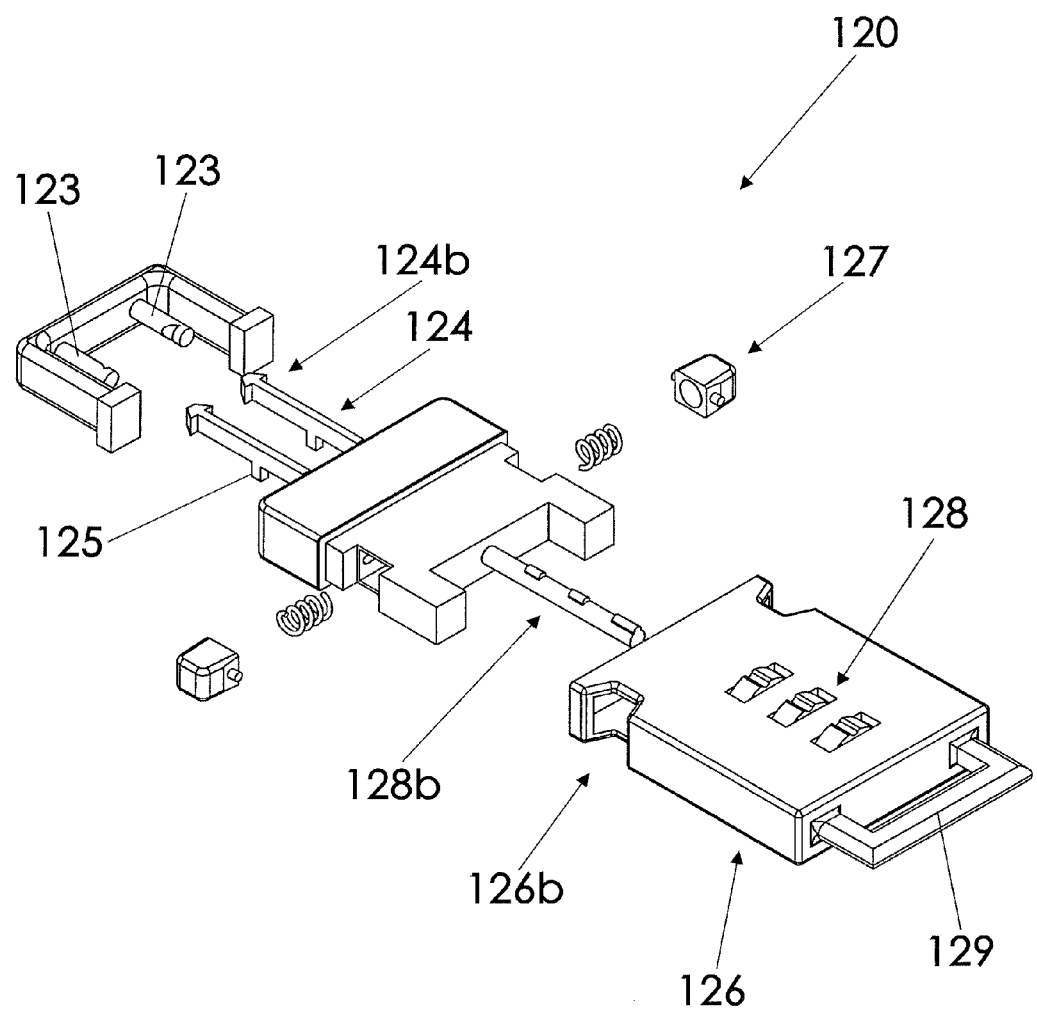
Figure 9A:
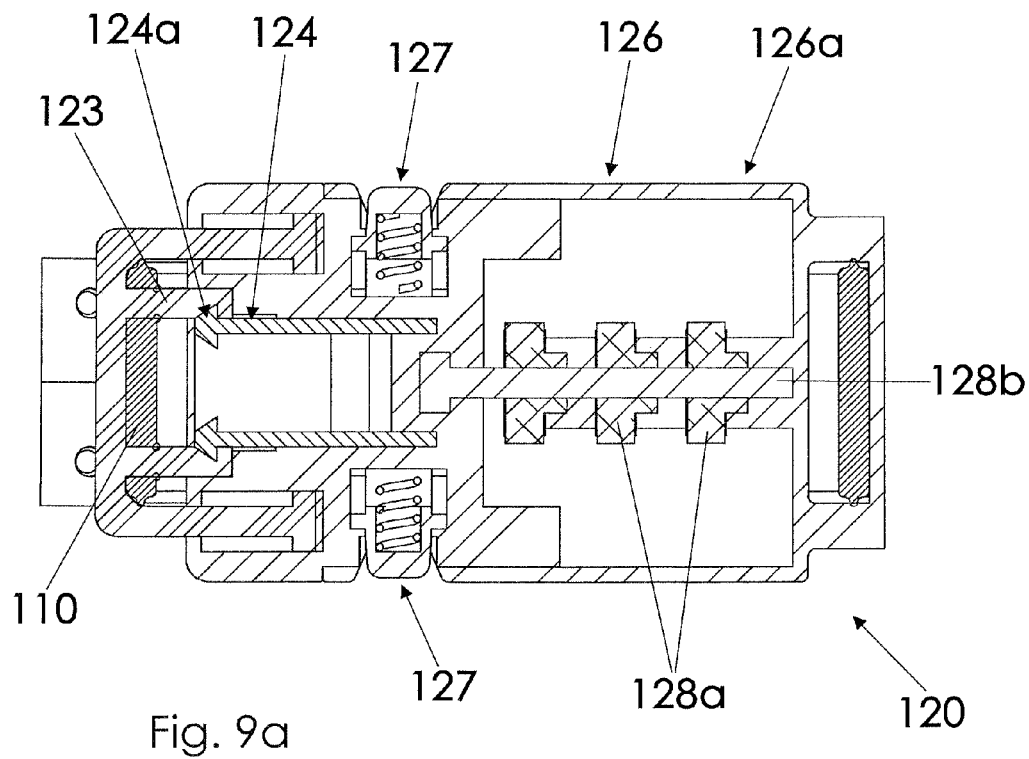
FIG. 9a is a sectional view taken along line 9a-9a of FIG. 7, with the casing shown in a locked configuration.
Figure 9B:
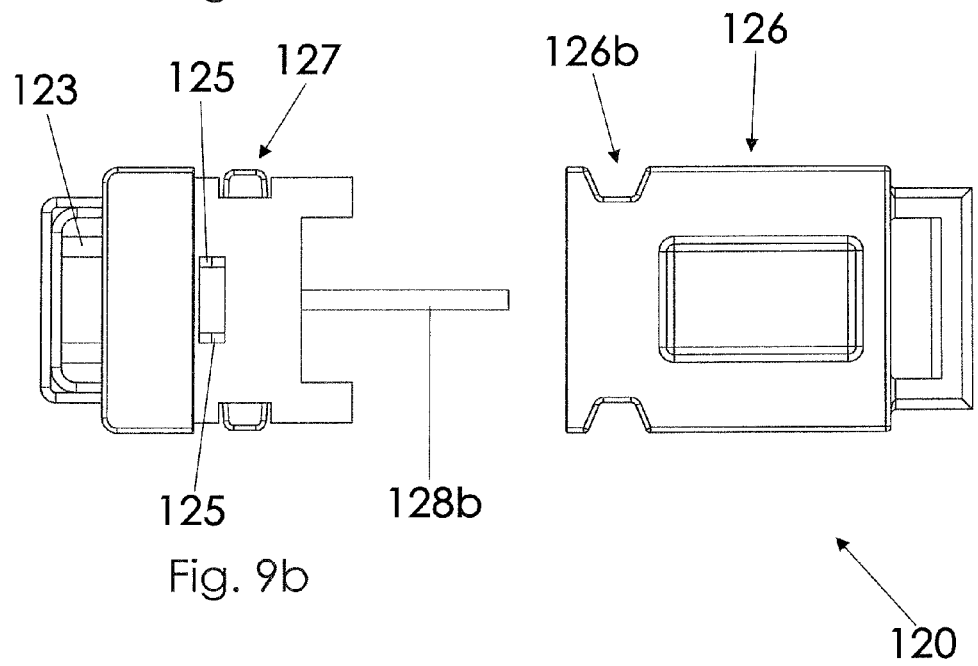
FIG. 9b is a back view of the casing as in FIG. 1.

In one embodiment (as shown in FIGS. 5b and 6, for example), the collar 110 includes a plurality of holes 116 between the first and second ends 112a, 112b and the fastener 120 includes a pin 123 configured to respectively interact with the holes 116. By respectively interacting the with holes 116, the pin 123 may secure the adjustable collar circumference 113 at any of a plurality of respective positions. A clasp 124 may be configured to secure the pin 123 when at a first position 124a (FIG. 9a) and release the pin 123 when at a second position 124b (FIG. 6). As shown in FIGS. 9a and 9b, an outer casing 126 may be movable between a closed configuration 126a (FIG. 9a) and an open configuration 126b (FIG. 9b) in which the clasp 124 is exposed. A lock 128 (e.g., a combination lock with tumblers 128a and a tumbler pin 128b) may be operatively coupled to the outer casing 126 to restrict movement of the outer casing 126 from the closed configuration 126a to the open configuration 126b, and the clasp 124 may be movable to the second position 124b only when the outer casing 126 is at the open configuration 126b. More particularly, the clasp 124 may be biased toward the first configuration 124a, and a portion 125 (FIG. 6) of the clasp 124 (or a separate element in communication with the clasp 124) may only be accessed when the outer casing 126 is at the open configuration 126b (FIG. 9b). The fastener 120 may additionally include a spring-biased push button 127 that operatively engages the outer casing 126 to restrict movement of the outer casing 126 from the closed configuration 126a to the open configuration 126b, as shown in FIGS. 6, 9a, and 9b.

Figure 10A:
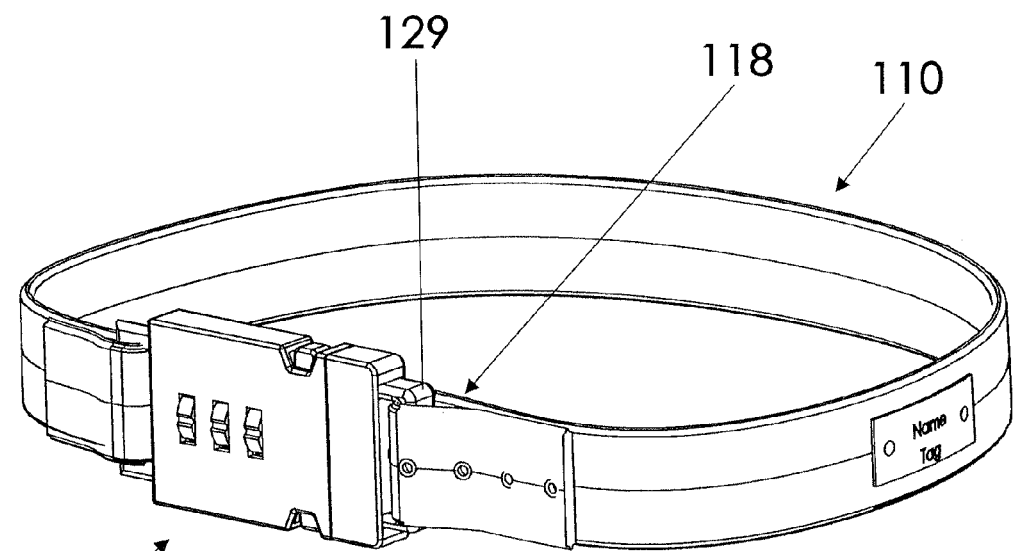
FIG. 10a is front elevation view of the collar of FIG. 1 removed from the remainder of the pet restraint system.
Figure 10B:
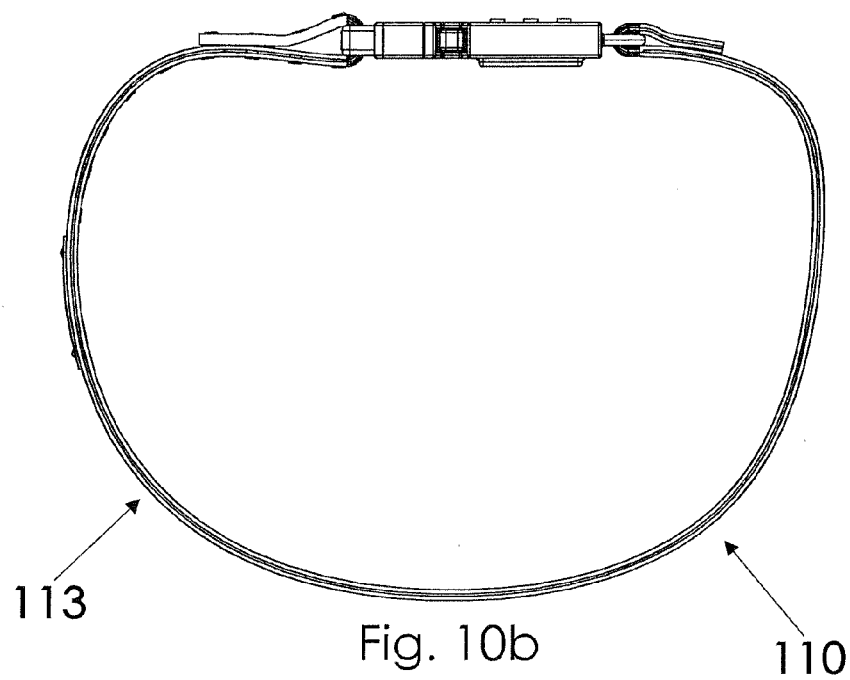
FIG. 10b is another top view of the collar as in FIG. 7.
Figure 11A:
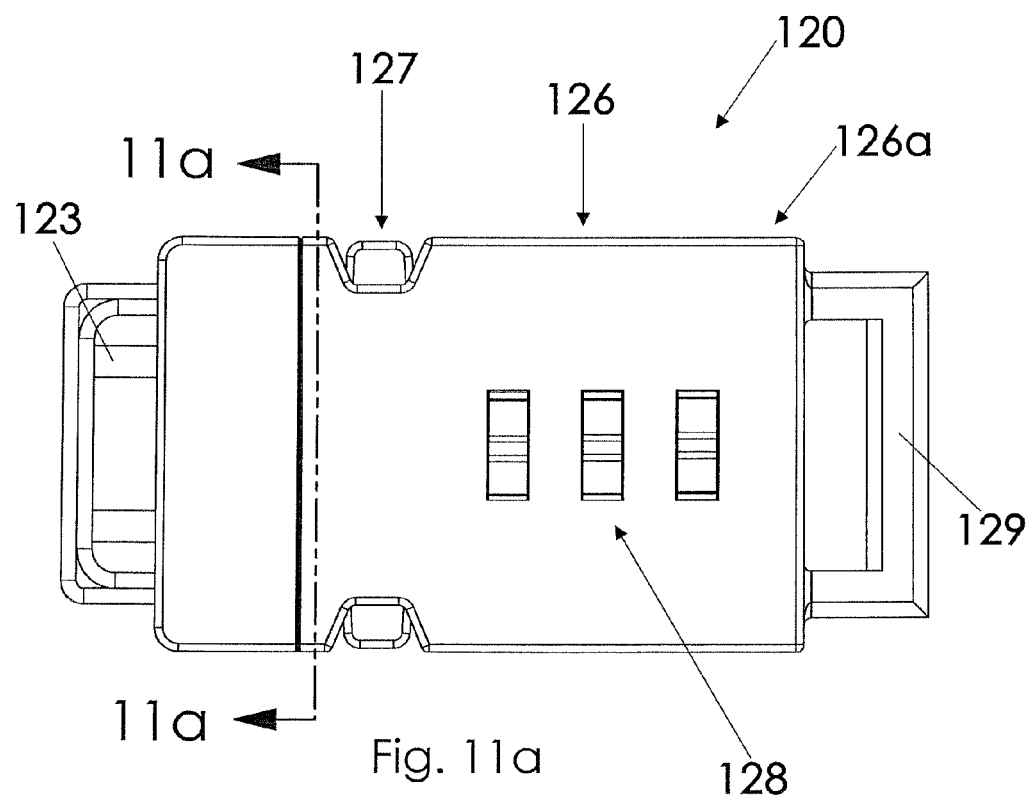
FIG. 11a is a front side view of the casing and first lock as in FIG. 5a and showing the casing in a locked configuration.
Figure 11B:
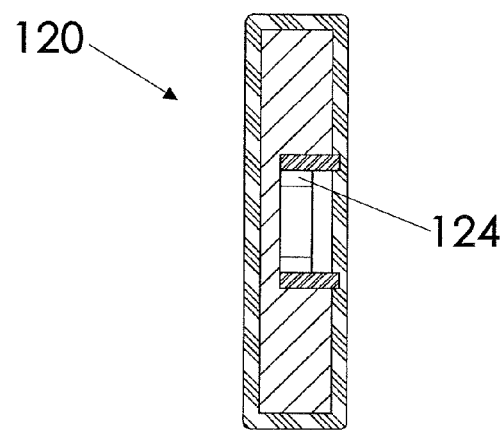
Figure 12A:
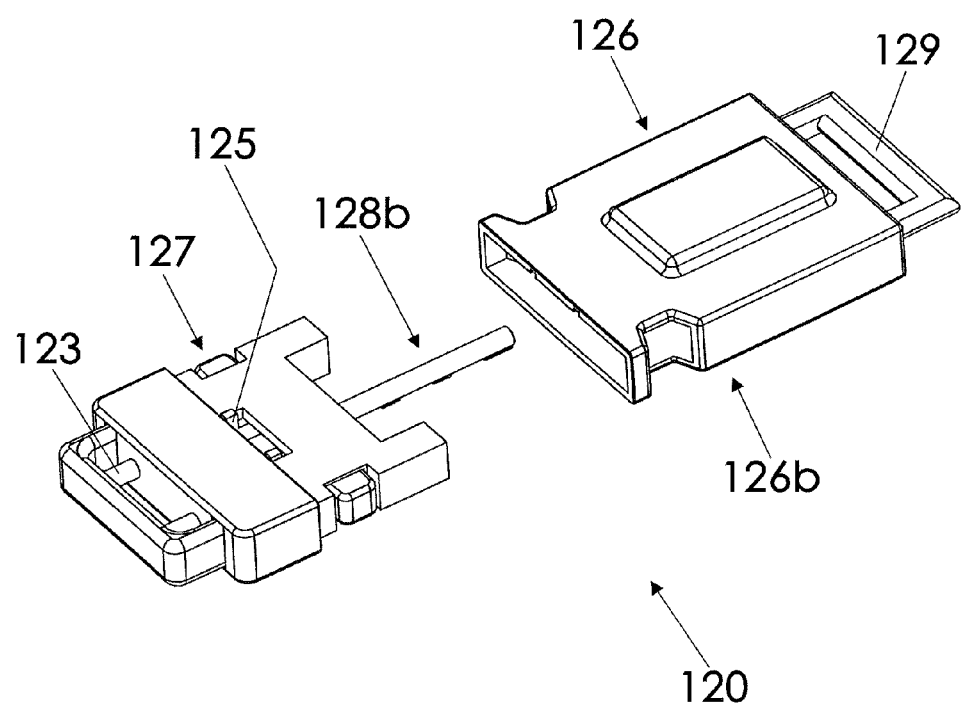
FIG. 12a is a perspective view of the casing in a released configuration.

As shown in FIGS. 7 and 10a, the second end 112b of the collar 110 may define a loop 118, the fastener 120 may include a hoop 129, and the hoop 129 may interact with the collar loop 118 to couple the fastener 120 to the collar 110. Any other method of fastening the collar 110 to the fastener 120 may also be acceptable.

Figure 1:
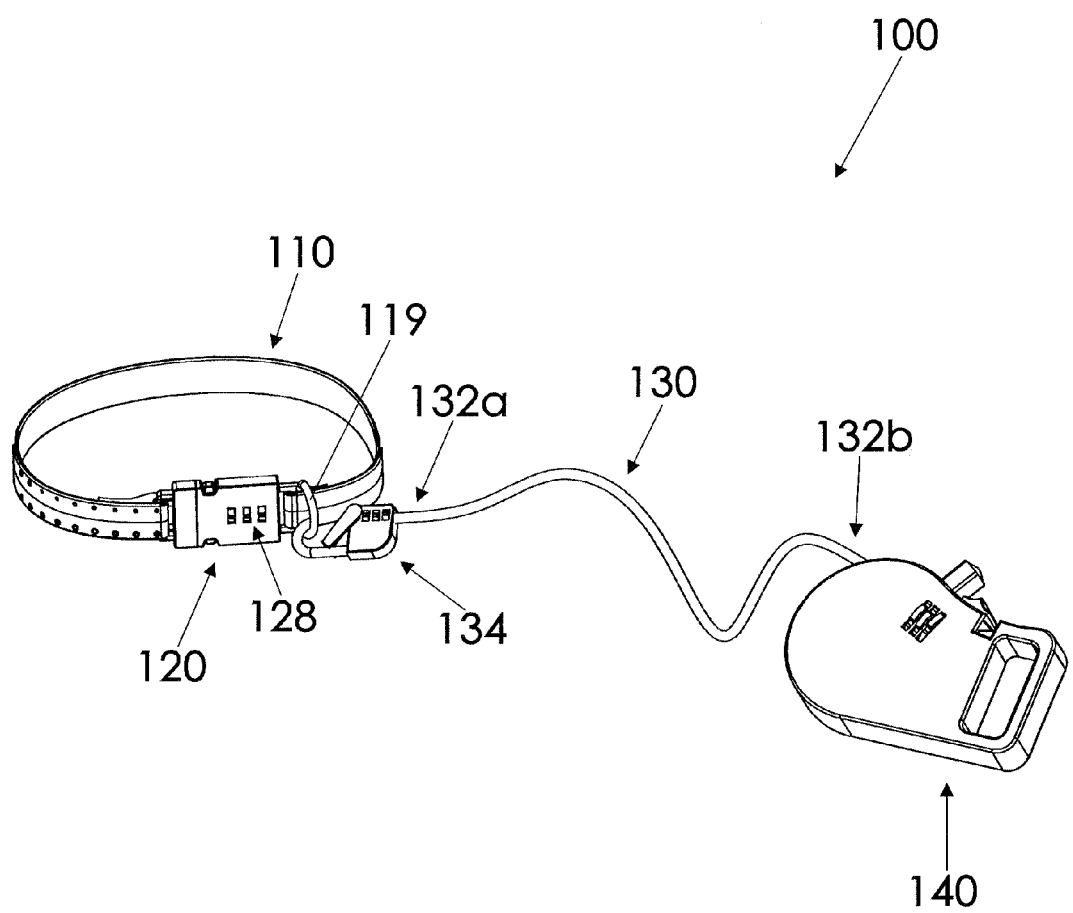
FIG. 1 is a perspective view of a pet restraint system according to a preferred embodiment of the present invention.
Figure 2:
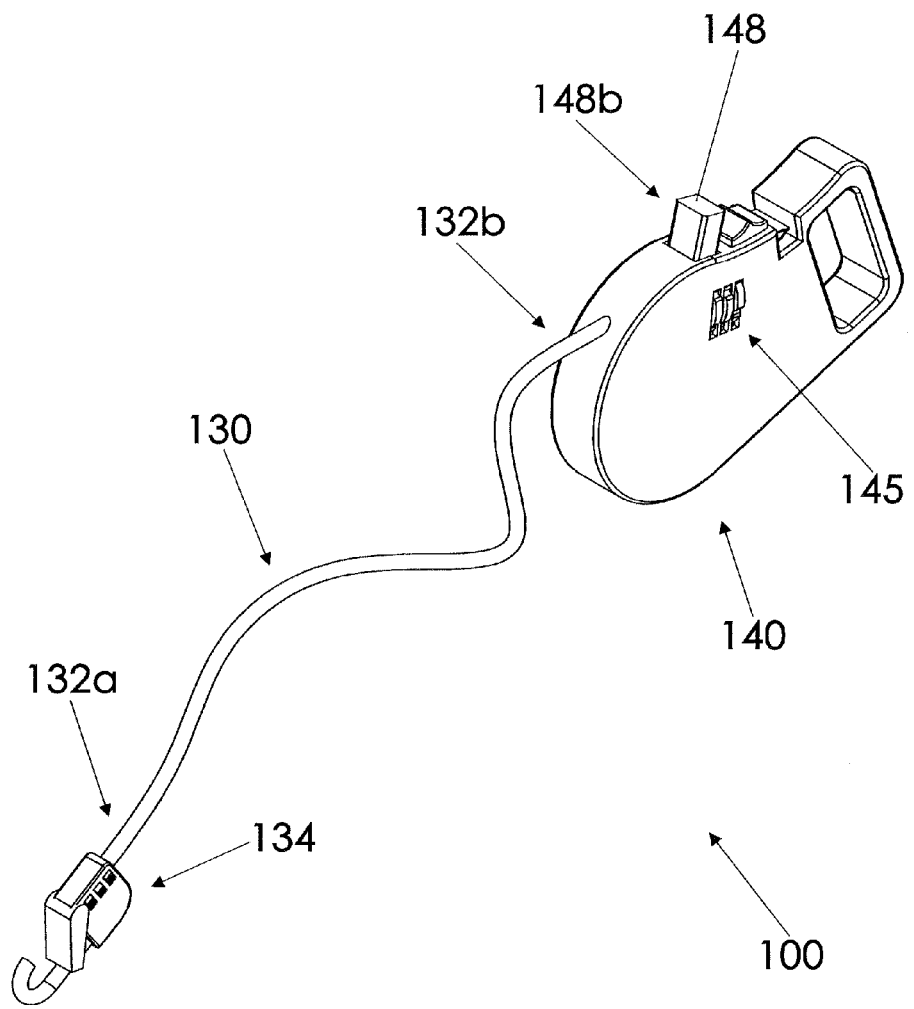
FIG. 2 is another perspective view of the pet restraint system as in FIG. 1 with the collar removed.
Figure 4A:
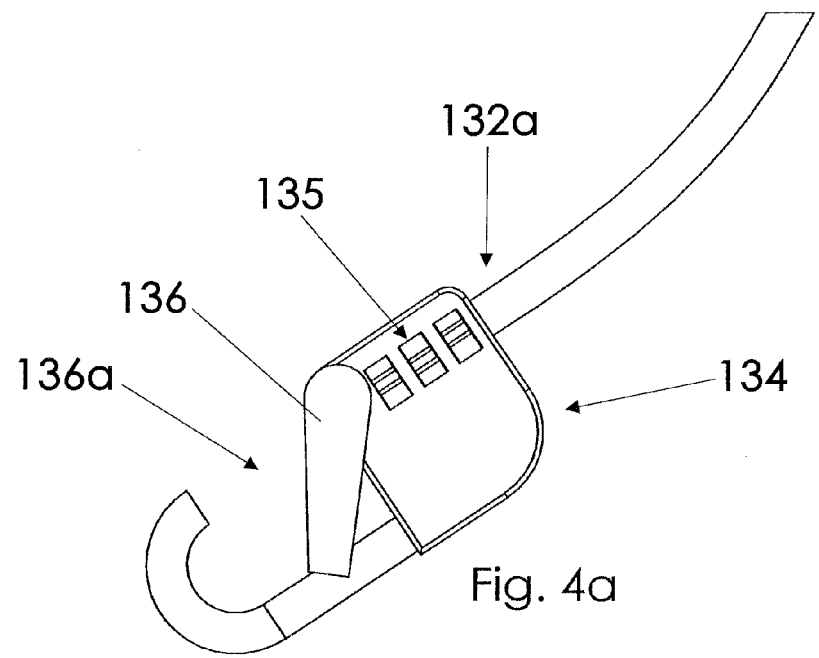
FIG. 4a is a side view on an enlarged scale of a clip as in FIG. 2 with a clip arm in an open configuration.
Figure 4B:
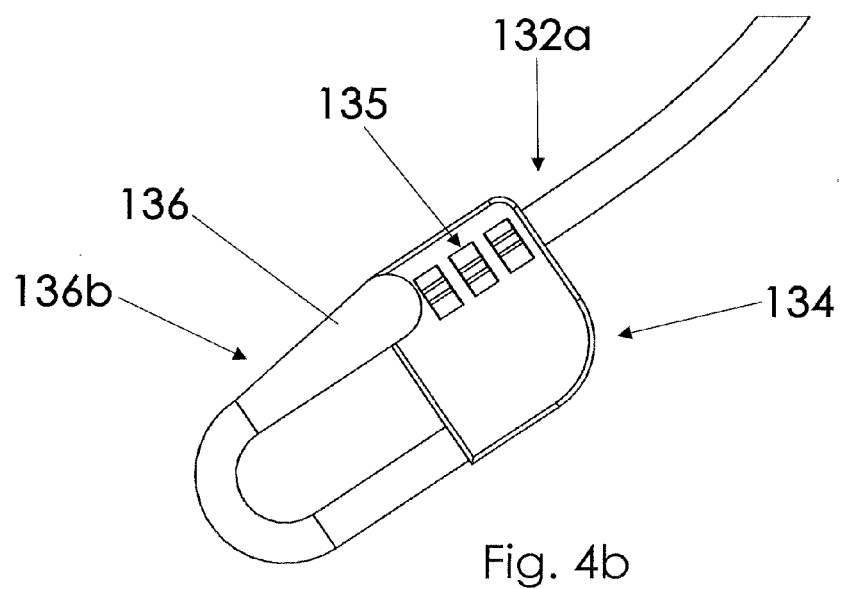
FIG. 4b is another side view as in FIG. 4a with the clip arm in a closed configuration.

The pet restraint system 100 may include an elongate leash 130 (FIG. 1) having first and second ends 132a, 132b, and a clip 134 may be permanently coupled to the leash first end 132a. The clip 134 may be configured to removably attach the leash first end 132a to the collar 110, as shown in FIG. 1, and a lock 135 (e.g., a combination lock) may be configured to restrict removal of the clip 134 from the collar 110. In one embodiment, as shown in FIGS. 4a and 4b, the clip 134 includes an arm 136 movable between an open configuration 136a (FIG. 4a) and a closed configuration 136b (FIG. 4b) and the lock 135 is configured to restrict movement of the clip arm 136 from the closed configuration 136b. The collar 110 may include a ring 119, as shown in FIGS. 1 and 5a, and the clip 134 may be configured to removably attach the leash first end 132a to the collar ring 119, or the clip may otherwise attach the leash first end 132a to the collar 110.

As shown in FIGS. 1 through 3b, a handle 140 may be permanently coupled to the leash second end 132b. The handle 140 includes a protrusion 142 movable between a release position 142a and a hold position 142b, and the protrusion 142 is configured to restrain the leash 130 only when at the hold position 142b. A lock 145 (e.g., a combination lock) is configured to restrict movement of the protrusion from the hold position 142b, and a button 144 may be used to move the protrusion 142 to the hold position 142b. In one embodiment, as shown in FIGS. 3a and 3b, the handle 140 defines a cavity 146 and the protrusion 142 extends at least partially across the cavity 146 when at the hold position 142b (FIG. 3a) to restrain the leash 130 in the cavity 142.

Figure 13:
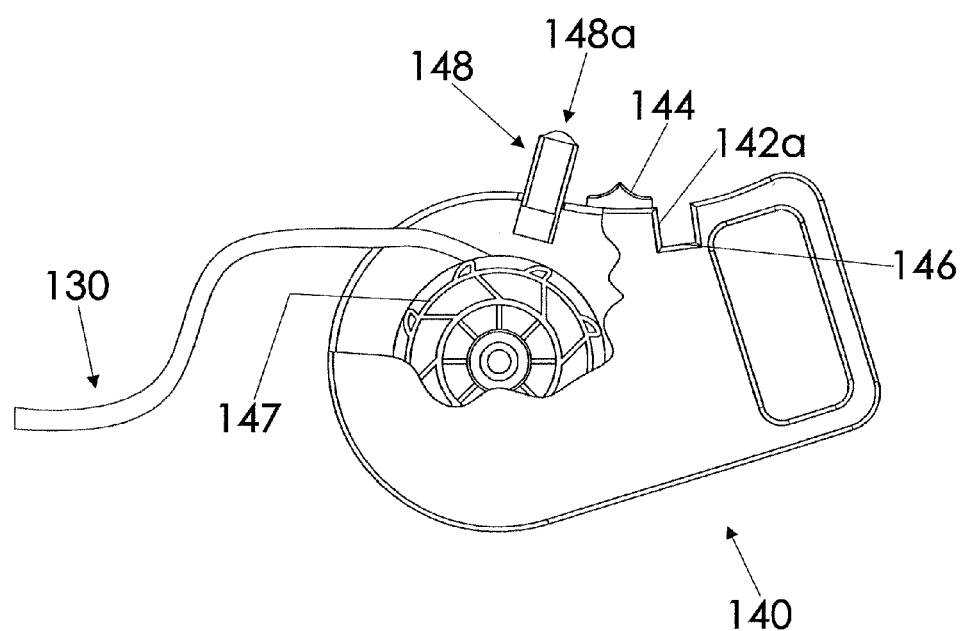
Figure 14:
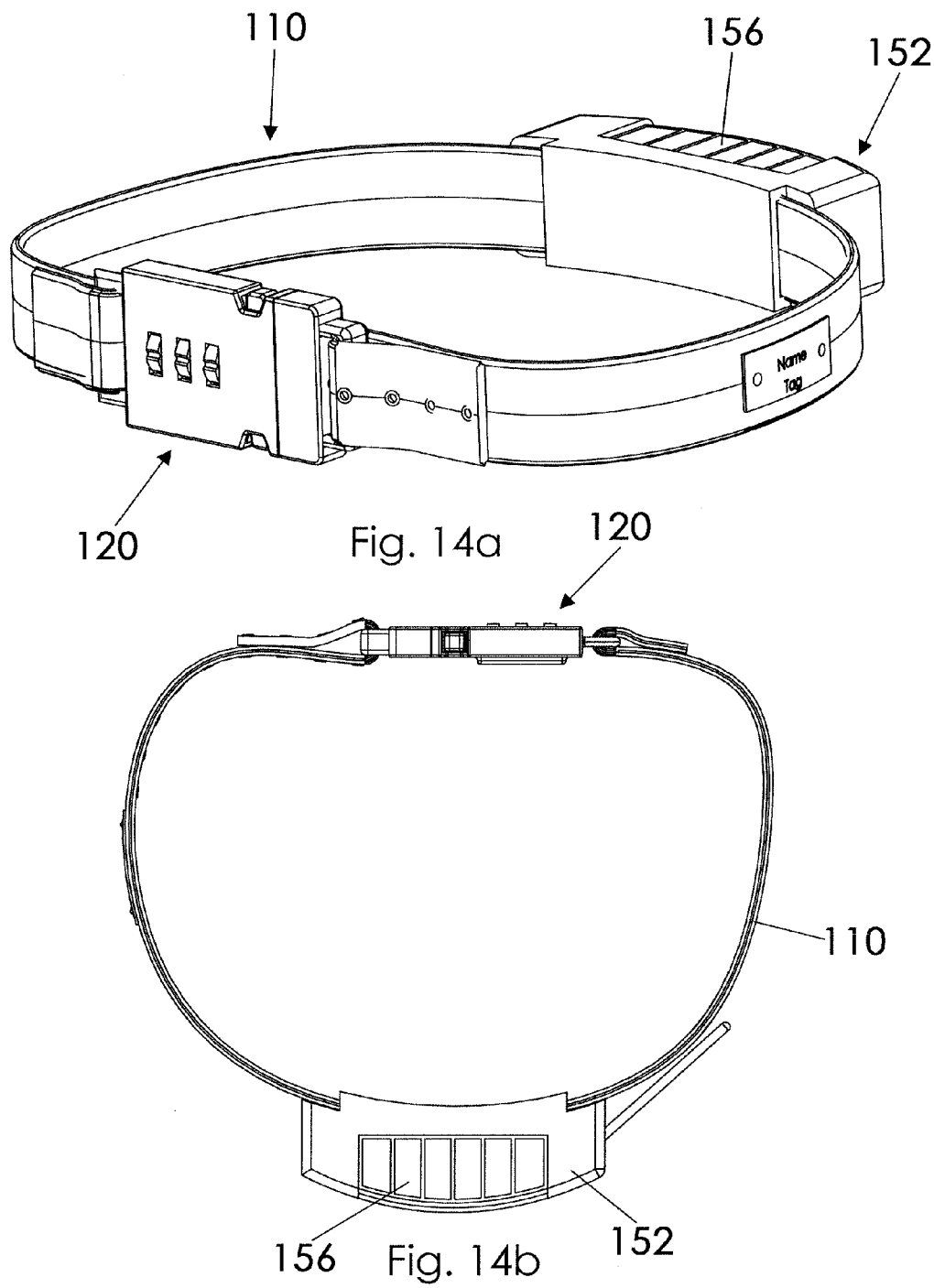

The handle 140 may include a retracting mechanism 147 coupled to the leash 130 to selectively retract the leash to a plurality of retraction positions, as shown in FIG. 13. In other words, the retracting mechanism 147 may alter the length of the portion of the leash 130 that extends outside the handle 140. A leash catch 148 may be movable between a release position 148a (FIGS. 3a and 3b) and a hold position 148b (FIG. 2), and the leash catch 148 may interact with the leash 130 and/or the retracting mechanism 147 when at the hold position 148b to secure the leash 130 at a respective retraction position (i.e., to temporarily determine the length of the portion of the leash 130 that extends outside the handle 140). The lock 145 or another lock may restrict movement of the leash catch 148 from the hold position 148b.

In use, the collar 110 is placed about an animal's neck (or at another desired position) and the fastener 120 secures together the first and second ends 112a, 112b of the collar 110. As detailed above, the pin 123 may interact with a chosen hole 116 in the collar 110, the clasp 124 may secure the pin 123 in place, and the outer casing 126 may enclose the clasp 124. The lock 128 and/or the spring-biased push button 127 may restrict movement of the outer casing 126 from the closed configuration 126a. To remove the collar 110, the lock 128 may be unlocked (e.g., by entering a proper combination) and the push-button 127 may be pressed to move the outer casing 126 to the open configuration 126b, and the clasp 124 may be moved to the second position 124b (FIG. 6) to release the pin 123.

The clip 134 may be coupled to the collar 110 (e.g., at the collar ring 119), and the lock 135 may restrict removal of the clip 134 from the collar 110. As detailed above, the clip arm 136 may be moved between the open and closed configurations 136a (FIG. 4a), 136b (FIG. 4b) to attach the clip 134 to the collar 110, and the lock 135 may restrict movement of the clip arm 136 from the closed configuration 136b. To separate the clip 134 from the collar 110, the lock 135 may be unlocked (e.g., by entering a proper combination), and the clip arm 136 may be moved from the closed configuration 136b (FIG. 4b) to the open configuration 136a (FIG. 4a).

The handle 140 may be used in a traditional manner (i.e., to direct the animal wearing the collar 110, such as during a walk) and/or the handle 140 may be used to couple the leash 130 to an object (e.g., a tree, sign, post, bench, etc.). To couple the leash 130 to the object, the handle 140 is wrapped so that the object is collectively encircled by the handle 140 and the leash 130 and the protrusion 142 is moved to the hold position 142b to restrain the leash 130. For example, the leash 130 may be inserted in the cavity 146 and the protrusion 142 may be moved to extend at least partially across the cavity 146 to restrain the leash 130 in the cavity 142. The leash catch 148 may be moved to the hold position 148b, and the lock 145 may restrict movement of the protrusion 142 from the hold position 142b and movement of the leash catch 148 from the hold position 148b. To separate the animal from the object, the lock 145 may be unlocked (e.g., by entering a proper combination) and the protrusion 142 may be moved to the release position 142a, releasing the leash 130 from the cavity 146.

Figure 15:
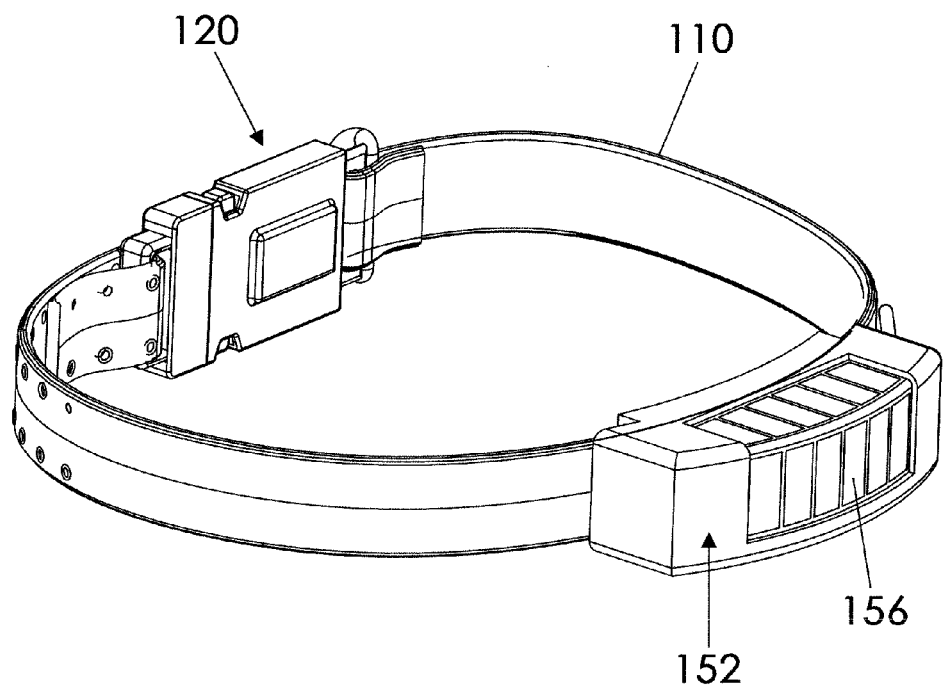
FIG. 15 is another perspective view of the collar from a rearward angle.
Figure 17:
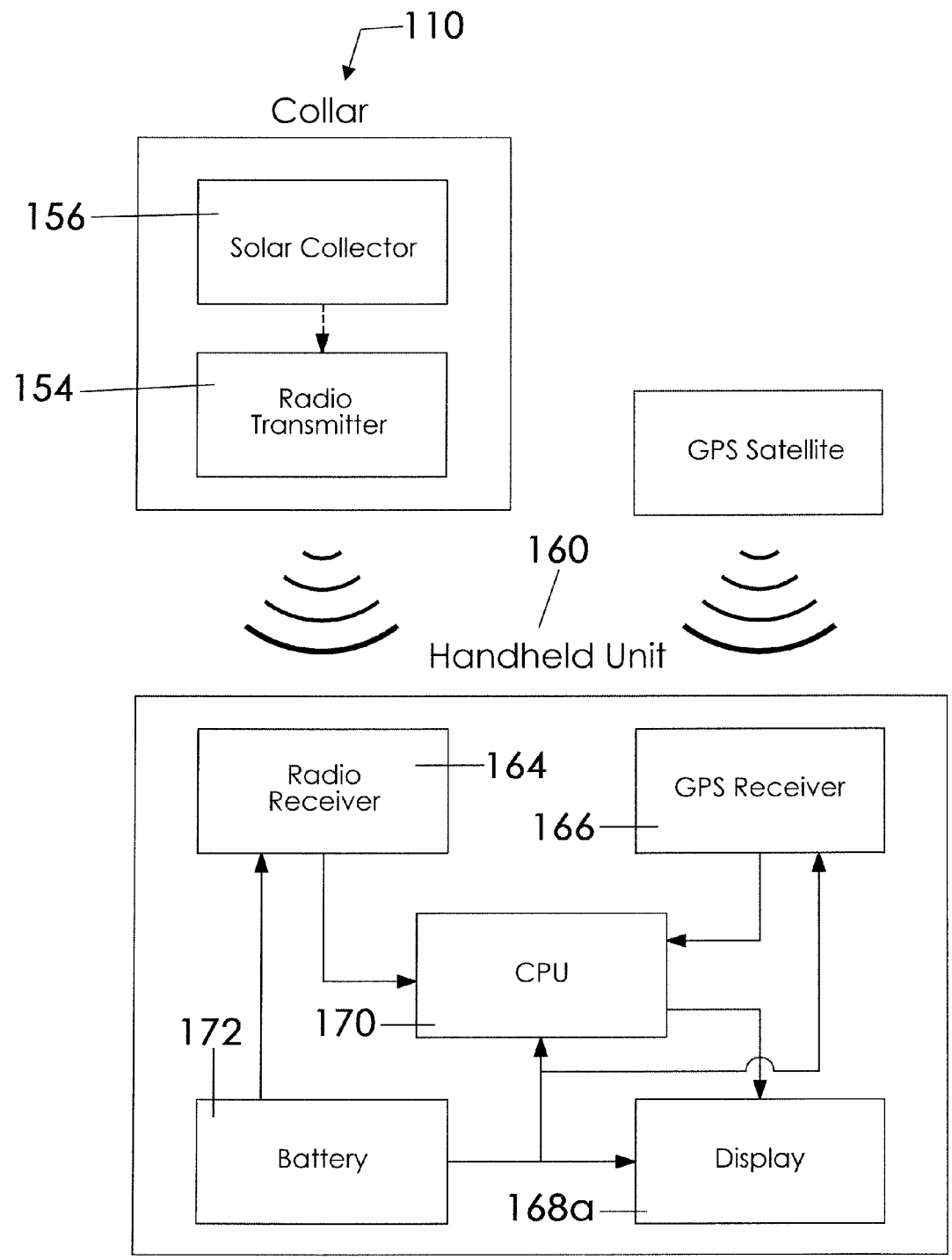
FIG. 17 is a block diagram according to the alternative embodiment of the present invention.
Figure 18:
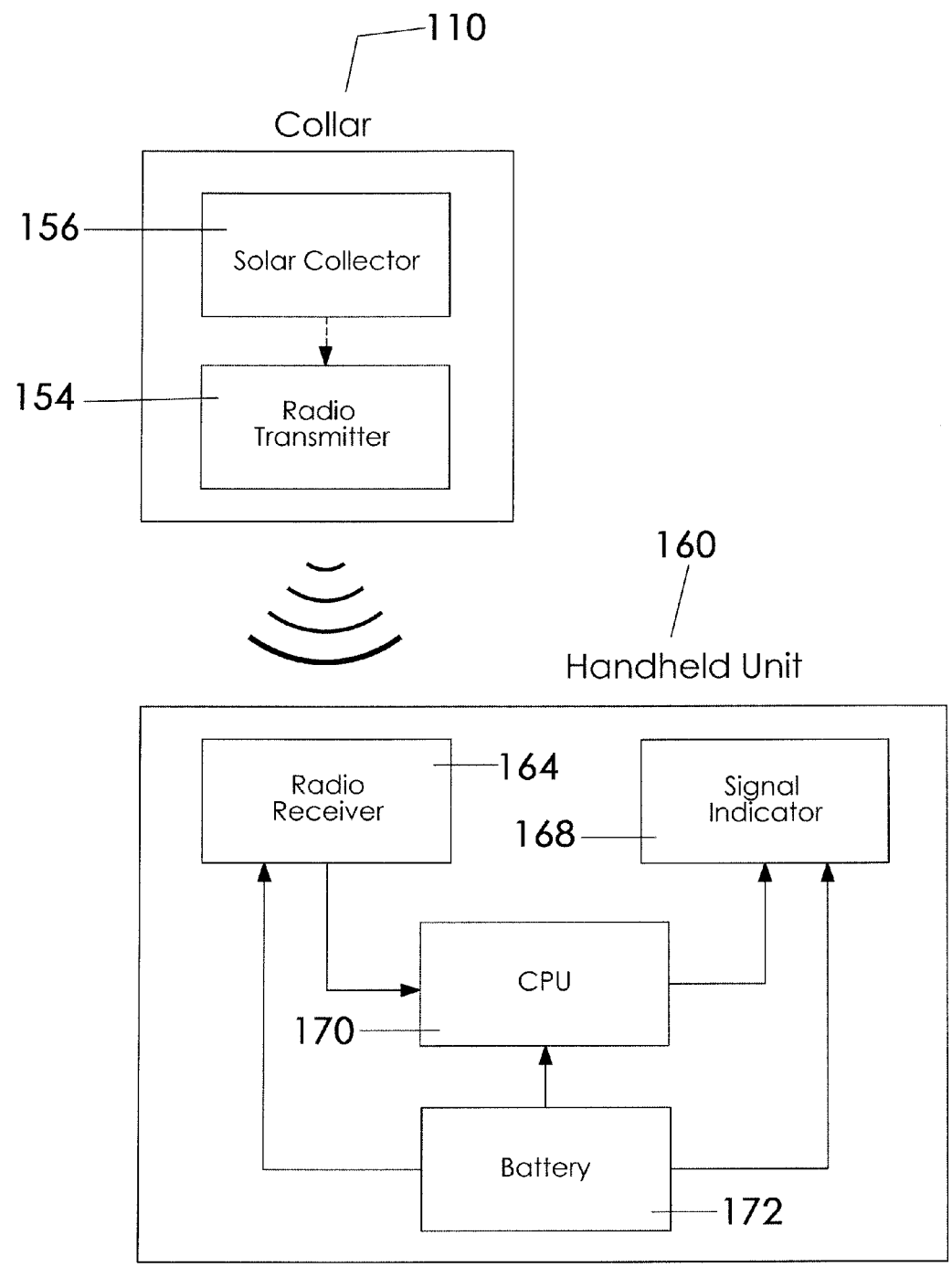
FIG. 18 is a block diagram according to a modified alternative embodiment.

A pet restraint system according to another embodiment of the present invention includes a construction that is substantially similar to the construction described above except as specifically noted below with reference to FIG. 14a to FIG. 18. In this embodiment, an electronics housing 152 may be coupled to the collar 110 (FIG. 14a to 15), the housing 152 defining an interior space suitable to receive electronic components as will be described below. The pet restraint system includes a radio transmitter 154 positioned in the housing 152 and, therefore, indirectly coupled to the collar 110 (FIGS. 17, 18). Of course, the radio transmitter 154 could be connected to the collar 110 without the housing 152 although the housing 152 provides desirable protection thereof from unintended impacts and weather elements. A power source, such as a solar collector 156, may be connected to an exterior surface of the housing 152 and electrically connected to the radio transmitter 154 (FIG. 15). The radio transmitter 154 is configured to transmit radio signals at a predetermined frequency when energized by the power source. A solar energy collection module is advantageous in that it may collect energy whenever a pet wearing the collar 110 is in a sunny environment.

Figure 16:
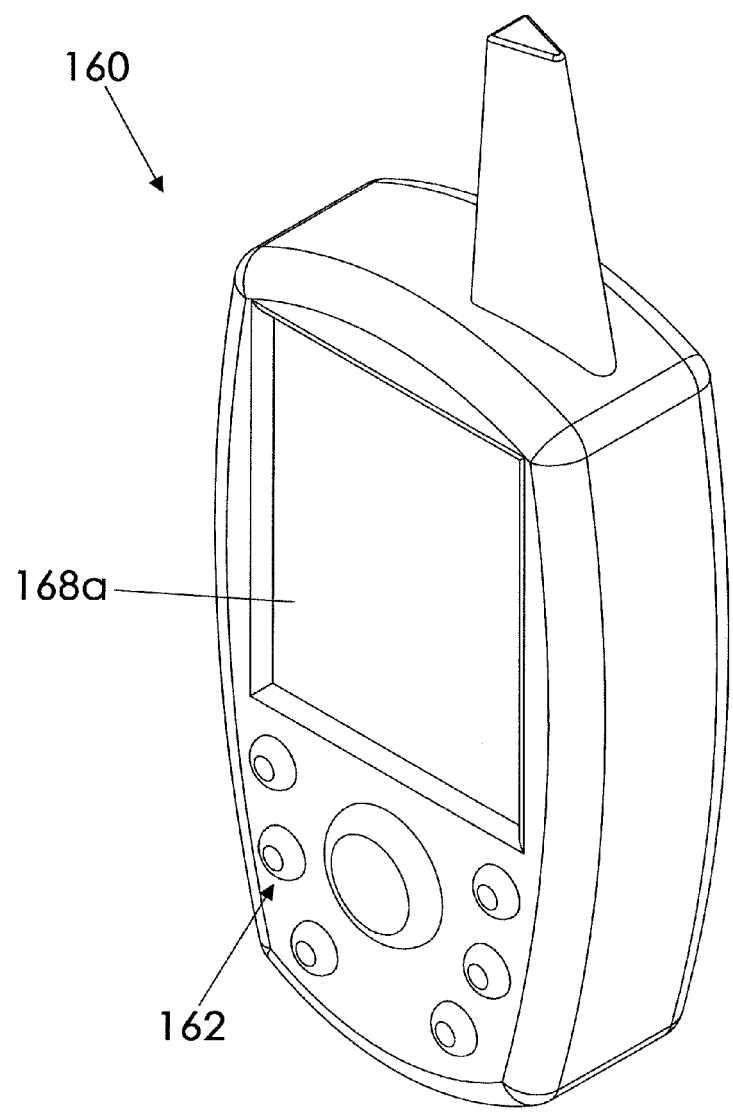
FIG. 16 is a perspective view of a handheld unit according to the alternative embodiment of the present invention.

The pet restraint system further includes a handheld unit 160 that is separate and independent from the collar 110 (FIG. 16). The handheld unit 160 defines an interior space in which electronic components may be housed and may include input buttons 162 for controlling output as will be described in more detail below. The handheld unit 160 may include a radio receiver 164 capable of receiving radio signals, a GPS receiver 166 capable of receiving signals from global positioning satellites, and a signal indicator 168 for outputting analyzed signal data (FIGS. 17-18). A central processing unit (CPU) 170 is also situated in the handheld unit 160 and is in data communication with the radio receiver 164, GPS receiver 166, and signal indicator 168. A battery 172 is also positioned in the handheld unit 160 and is electrically connected to the aforementioned components so as to selectively energize them.

The CPU 170 includes programming for evaluating a relative strength of signals received by the radio receiver 164. In other words, the CPU is capable of determining if a stream of incoming radio signals are getting stronger or weaker. Further, the CPU 170 includes programming for outputting the analyzed signal strength information, either by transmission or electrical wire, to the signal indicator 168 indicative of a position of the radio transmitter 154 relative to the radio receiver 164 (and thus to the handheld unit 160). The signal indicator 168 may be an audible device, such as a piezoelectric buzzer or other speaker such that an audible output would get stronger (e.g. louder or more frequent beeps) if signals received by the radio receiver 164 were strong or such that an audible output would get weaker (e.g. softer or less frequent beeps) if signals received by the radio receiver 164 were weak. In the device illustrated in FIG. 18, a missing collar (e.g. a lost or stolen pet) may be located relative to the handheld unit 160. As signals become stronger, a searcher may continuously search closer and closer to the collar/pet until it is found.

The CPU 170 may include programming for evaluating GPS signals received by the GPS receiver and for calculating a global position of the collar 110 from the received GPS signals. Further, the CPU 170 includes programming for outputting the calculated global position data to the signal indicator 168 indicative of a position of the handheld unit 160. In the instance where a GPS receiver 166 is included in the handheld unit 160, the signal indicator 168 is preferably a visual display 168a such that a global position of the handheld unit 160 may be graphically displayed to a user. By knowing the exact location of the handheld unit 160, a searcher may utilize known landmarks to predict the collar's location or be able to direct others to the location.

In use, the collar 110 is placed about an animal's neck and utilized in the manner of the embodiment first described above. If, however, the animal becomes missing, whether due to a failure to adequately secure the animal to an object or through a criminal act, the owner may utilize the additional components described as the alternative embodiment to locate the collar 110 and the animal. More particularly, an owner may activate the handheld unit 160 so that the radio transmitter 154 is energized to transmit radio signals. As the radio receiver 164 in the handset receives these signals, the CPU evaluates their strength and sends the evaluated signal data to the signal indicator which emits respective audible tones indicative of the signal strength. In addition, the GPS receiver 166 may receive signals from GPS satellites. Accordingly, the CPU evaluates the GPS signals and outputs the evaluated signal data to a visual display indicative of a global position of the GPS receiver 166 and collar 110. It is understood that when the display 168a serves as the signal indicator 168, the display 168a may show a visual indication of the strength of incoming signals.

Accordingly, the general direction of the collar 110 relative to the handheld unit 160 may be determined by evaluation and audio or visual output of the radio signals. In addition, the exact global position of the handheld unit 160 may be determined by evaluation and output of the global position satellite signals. Together, the animal owner is able to determine the exact location of the handheld unit 160 and then the location of the collar 110 relative to the handheld unit 160. This combination of tracking components gives a pet owner confidence that a lost collar 110 may be found and, with the other locking components, that the lost pet will be found with the collar 110.

It is understood that the collar 110 described above in relation to the alternative embodiment may be utilized with the leash and locking devices described previously.

It is understood that while certain forms of this invention have been illustrated and described, it is not limited thereto except insofar as such limitations are included in the following claims and allowable functional equivalents thereof.

The invention claimed is:

1. A pet restraint system, comprising:
   a flexible collar having first and second ends and a plurality of holes therebetween;
   a fastener configured to selectively secure together said first and second collar ends to present an adjustable circumference for encircling a portion of a pet, said fastener including:
      a pin configured to respectively interact with said holes to secure said adjustable collar circumference in a plurality of respective positions;
      a clasp configured to secure said pin when at a first position and release said pin when at a second position; and
      an outer casing movable between a closed configuration enclosing said clasp and an open configuration exposing said clasp;
      a lock configured to restrict separation of said first and second collar ends, said lock being operatively coupled to said outer casing to restrict movement of said outer casing from said closed configuration to said open configuration;
   wherein said clasp is movable to said second position only when said outer casing is at said open configuration;
   a radio transmitter coupled to said collar that emits a signal at a predetermined frequency;
   a handheld unit separated from said collar and including:
      a radio receiver configured to receive a radio signal;
      a GPS receiver adapted to receive signals from global positioning satellites;
      a signal indicator;
      a central processing unit (CPU) in data communication with said radio receiver, said GPS receiver, and said signal indicator;
   wherein said CPU includes programming for evaluating a relative strength of signals received by said radio receiver;
   wherein said CPU includes programming to output said relative strength to said signal indicator indicative of a position of said signal transmitter relative to said handheld unit.

2. The pet restraint system as in claim 1, further comprising:
   a GPS receiver positioned in said handheld unit;
   wherein:
      said signal indicator is a display;
      said CPU includes programming for evaluating said GPS signals received by said GPS receiver and calculating global position data from said GPS signals;
      said CPU includes programming for outputting said global data to said display indicative of a position of said handheld unit.

3. The pet restraint system as in claim 2, further comprising a solar cell coupled to said collar and electrically connected to said radio transmitter; and
   wherein said handheld unit includes a battery electrically connected to said CPU.

4. The pet restraint system as in claim 2, further comprising:
   an elongate leash having first and second ends;
   a clip permanently coupled to said leash first end, said clip being configured to removably attach said leash first end to said collar;
   a second lock configured to restrict removal of said clip from said collar; and
   a handle permanently coupled to said leash second end, said handle including:
      a retracting mechanism coupled to said leash to selectively retract said leash to a plurality of retraction positions;
      a leash catch movable between a release position and a hold position, said leash catch interacting with at least one of said leash and said retracting mechanism when at said hold position to secure said leash at a respective said retraction position;
      a protrusion movable between a release position and a hold position, said protrusion being configured to restrain said leash only when at said hold position; and
   a third lock configured to restrict movement of said leash catch from said hold position and restrict movement of said protrusion from said hold position.

5. The pet restraint system as in claim 4, wherein at least one of said first lock, said second lock, and said third lock includes a combination lock.

6. The pet restraint system as in claim 4, wherein said collar includes a cut-resistant material permanently affixed within an outer member.

7. The pet restraint system of claim 4, further comprising a solar cell coupled to said collar and electrically connected to said radio transmitter; and
   wherein said handheld unit includes a battery electrically connected to said CPU.

8. The pet restraint system of claim 4, wherein:
   said clip includes an arm movable between an open configuration and a closed configuration;
   said second lock is configured to restrict movement of said clip arm from said closed configuration;
   said fastener includes a spring-biased push button operatively engaged with said outer casing to restrict movement of said outer casing from said closed configuration to said open configuration;
   said handle defines a cavity; and
   said protrusion extends at least partially across said cavity when at said hold position to restrain said leash in said cavity.

* * * * *